(12) United States Patent
Furuya et al.

(10) Patent No.: US 7,164,195 B2
(45) Date of Patent: Jan. 16, 2007

(54) SEMICONDUCTOR DEVICE AND SEMICONDUCTOR DEVICE MANUFACTURING METHOD

(75) Inventors: Yuuki Furuya, Kanagawa (JP); Akihisa Iguchi, Tokyo (JP); Kentarou Arai, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/929,373

(22) Filed: Aug. 31, 2004

(65) Prior Publication Data

US 2005/0023706 A1 Feb. 3, 2005

Related U.S. Application Data

(62) Division of application No. 10/131,228, filed on Apr. 25, 2002, now Pat. No. 6,787,892.

(30) Foreign Application Priority Data

Apr. 27, 2001 (JP) ............................. 2001-132335
Apr. 24, 2002 (JP) ............................. 2002-121900

(51) Int. Cl.
*H01L 23/48* (2006.01)
(52) U.S. Cl. ...................... 257/693; 257/797; 438/401; 438/452
(58) Field of Classification Search ................ 257/693, 257/797; 438/401, 462
See application file for complete search history.

(56) References Cited

U.S. PATENT DOCUMENTS 5,777,392 A * 7/1998 Fujii ........................... 257/797
6,046,508 A * 4/2000 Miyatake ..................... 257/797
6,501,189 B1 * 12/2002 Kim et al. .................... 257/797
6,525,422 B1 2/2003 Ono et al.
6,577,019 B1 * 6/2003 Roberts et al. ............. 257/797
6,787,892 B1 * 9/2004 Furuya et al. .............. 257/687
6,849,957 B1 * 2/2005 Takeuchi et al. ............ 257/797
6,856,029 B1 * 2/2005 Daniel et al. ............... 257/797
6,869,869 B1 * 3/2005 Roberts et al. ............. 438/612
6,881,611 B1 4/2005 Fukasawa et al.
2001/0048145 A1 * 12/2001 Takeuchi et al. ............ 257/620

FOREIGN PATENT DOCUMENTS

| JP | 04-067641 | 3/1992 |
|---|---|---|
| JP | 09-320911 | 12/1997 |
| JP | 10-79362 | 3/1998 |
| JP | 10-308410 | 11/1998 |
| JP | 11-274361 | 10/1999 |
| JP | 2000-174046 | 6/2000 |
| JP | 2000-299333 | 10/2000 |
| JP | 2001-35970 | 2/2001 |
| JP | 2001-53177 | 2/2001 |

* cited by examiner

*Primary Examiner*—Fernando L. Toledo
(74) *Attorney, Agent, or Firm*—VolentineFrancos& Whitt,PLLC

(57) ABSTRACT

In a semiconductor device including a semiconductor wafer having a first main surface where a circuit element is formed, electrode pads are formed at an upper portion of the first main surface of the semiconductor wafer electrically connected with the circuit element. Index marks are formed on a second main surface of the semiconductor wafer that is opposite the first main surface. The index marks consist of line segments and indicate a direction along which the semiconductor device is to be mounted.

5 Claims, 11 Drawing Sheets

SEMICONDUCTOR DEVICE AND SEMICONDUCTOR DEVICE MANUFACTURING METHOD

This is a divisional application of application Ser. No. 10/131,228, filed Apr. 25, 2002, now U.S. Pat. No. 6,787,892, which is hereby incorporated by reference in its entirety for all purposes.

BACKGROUND OF THE INVENTION

The present invention relates to a chip size package (CSP) and a manufacturing method thereof, and more specifically, it relates to a technology characterized by the structure of information (hereafter referred to as index marks) such as characters or symbols that indicate the direction along which the package is mounted at a mounting substrate and the direction of the package itself.

DESCRIPTION OF THE RELATED ART

The chip size package (CSP) technology in which the size of a semiconductor device package is set roughly equal to or slightly larger than the size of the semiconductor chip (bare chip) is adopted to realize high-density mounting of semiconductor devices on a mounting substrate. By setting connection terminals (external connection terminals) used to achieve connections with the mounting substrate in a grid pattern at the main surface (circuit forming surface) of a semiconductor chip formed in a roughly square shape, the size of the semiconductor device package can be set substantially equal to or slightly larger than the size of the semiconductor chip. Such a chip size package requires a smaller area to be occupied by the semiconductor device mounted on the mounting substrate and, at the same time, since it reduces the length of wiring used to connect the electrodes on the semiconductor chip and the external connection terminals, it achieves an improvement in the operating speed of the semiconductor device.

There is also a technology proposed in the related art that is achieved by packaging a semiconductor device still in a wafer state. (hereafter referred to as a wafer-level CSP). A wafer-level CSP is packaged before cutting out individual semiconductor chips from the wafer. The wafer-level CSP technology, which allows an integration of the packaging process and the wafer process, achieves an advantage in that the production cost can be greatly reduced.

An index mark is provided at a semiconductor device. This index mark is added to indicate the direction along which the semiconductor device is mounted at the mounting substrate. In the semiconductor device in a wafer-level CSP, for instance, the index mark is normally provided on the rear surface (a circuit non-forming surface) of the semiconductor device so as to allow the semiconductor substrate mounting direction to be visually ascertained when mounting the semiconductor device at the mounting substrate.

However, since index marks must be added at individual semiconductor devices in the index mark indication system adopted in the related art, the following problems arise.

1) It is necessary to adjust the positional relationship of an index mark to the corresponding semiconductor device on a one-on-one the basis. This sets a limit to the processing capability and also requires a special process for adding the index marks.
2) Ink-based index marks, for instance, may become worn off to disable the directional verification, whereas index marks formed by using laser light or the like may cause a degradation in the internal circuit pattern attributable to the laser light transmitted through the silicon layer.
3) The adjustment of the positional relationship of the index mark and the semiconductor device becomes more difficult as the size of semiconductor device is reduced. In addition, as the index mark itself becomes smaller in a smaller semiconductor device, the verification of the mounting direction that must be performed when mounting the semiconductor device at the mounting substrate also becomes more difficult.

SUMMARY OF THE INVENTION

An object of the present invention, which has been completed by addressing the problems of the semiconductor devices in the prior art discussed above, is to provide a new and improved semiconductor device and a new and improved semiconductor device manufacturing method that allow an index mark to be provided through a simpler process.

Another object of the present invention is to provide a new and improved semiconductor device and a new and improved semiconductor device manufacturing method that prevent an index mark from coming off and also prevent degradation of the circuit pattern.

Yet another object of the present invention is to provide a new and improved semiconductor device and a new and improved semiconductor device manufacturing, method that allow easy adjustment of the position of an index mark relative to the external dimensions of the semiconductor device and facilitate the verification of the mounting direction when the semiconductor device is mounted at a mounting substrate even when the size of the semiconductor device is reduced.

In order to achieve the objects described above, in a first aspect of the present invention, a semiconductor device comprising a semiconductor substrate that includes a main surface having a circuit element formed thereupon, a plurality of electrode pads formed at an upper portion of the main surface of the semiconductor substrate and electrically connected with the circuit element, a sealing resin that seals the upper portion of the main surface of the semiconductor substrate and a plurality of external connection terminals formed at the upper portion of the main surface of the semiconductor substrate so as to project out of the surface of the sealing resin and arranged in a substantially regular array over specific intervals from one another, characterized in that at least one of the plurality of external connection terminals is formed in a shape different from the shape of the other external connection terminals, is provided.

In order to achieve the objects described above, in another aspect of the present invention, a semiconductor device comprising a semiconductor substrate that includes a main surface having a circuit element with a specific function formed thereupon, a plurality of electrode pads formed at an upper portion of the main surface of the semiconductor substrate and electrically connected with the circuit element, a sealing resin that seals the upper portion of the main surface of the semiconductor substrate and a plurality of external connection terminals formed at the upper portion of the main surface so as to project out of the surface of the sealing resin and arranged in a substantially regular array over specific intervals from one another, which is characterized in that at least one of the side surfaces of the semiconductor device is colored differently-from the other side surfaces, is provided.

In yet another aspect of the present invention, a semiconductor device comprising a semiconductor substrate that includes a first main surface having a circuit element formed thereupon and a second main surface facing substantially opposite the first main surface, a plurality of external terminals formed at an upper portion of the first main surface and electrically connected with the circuit element and a direction index mark constituted of a line segment which includes a start point and an end point and an end point mark added at the end point and is formed on the second main surface is provided.

In yet another aspect of the present invention, a semiconductor device manufacturing method achieved by first sealing semiconductor devices in a wafer state and then cutting out the individual semiconductor devices from the wafer, which is characterized in that information indicating the direction of the semiconductor devices is added onto a rear surface of the wafer before cutting out the individual semiconductor devices from the wafer, is provided.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1A:
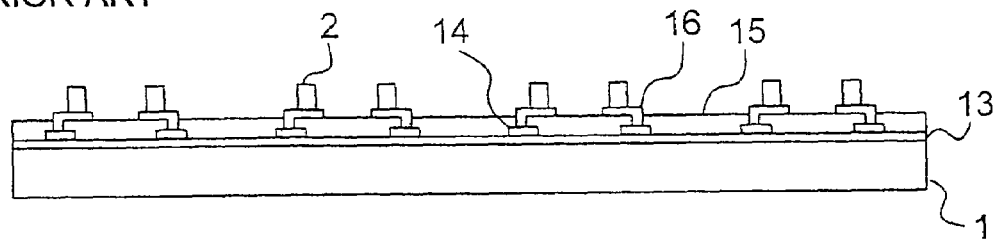
FIGS. 1(A)–1(E) illustrate chip size package manufacturing processes.

The following is a detailed explanation of the preferred embodiments of the semiconductor device and the semiconductor device manufacturing method according to the present invention, given in reference to the attached drawings. It is to be noted that the same reference numerals are assigned to components achieving substantially identical functions and structural features in the specification and the drawings to preclude the necessity for a repeated explanation thereof. First, an explanation is given on the standard wafer-level CSP technology in reference to FIGS. 1(A)–1(E), 2(A) and 2(B).

(A) Copper Post Formation

First, electronic circuits (not shown) achieving specific functions are formed on the main surface (circuit forming surface) of a semiconductor wafer 1 through a normal wafer process. Then, an insulating film 13 which includes openings (not shown) is formed at an upper portion of the main surface. Subsequently, electrode pads 14 and wirings (not shown) for connecting the electrode pads 14 to the electronic circuits are formed. The electrode pads 14 are formed on the insulating film 13.

Next, an insulating film 15 is formed over the entire main surface of the semiconductor wafer 1. Openings through which the surfaces of the electrode pads 14 are partially exposed are formed in the insulating film 15 through a photolithography technology.

Then, wirings 16 are formed over the exposed surfaces of the electrode pads 14 and also over the insulating film 15.

In the following step, a resist is applied onto the entire main surface of the semiconductor wafer 1. Openings having a specific shape are formed in the resist through a photolithography technology. These openings are positioned over the surfaces of the wirings 16.

Subsequently, copper posts 2 constituted of copper are formed within the openings in the resist through electroplating. These copper posts 2 are set in a grid pattern (matrix pattern) when viewed from a position above each semiconductor device. These copper posts 2 function as wirings for electrically connecting the electrode pads 14 and the wirings 16 formed on the semiconductor wafer 1 to external connection terminals 5 which are formed on the copper posts 2 during a post process.

It is to be noted that the resist pattern used for the formation of the copper posts 2 is to be described in detail later (see FIG. 1A).

(B) Resin Sealing

Figure 1B:
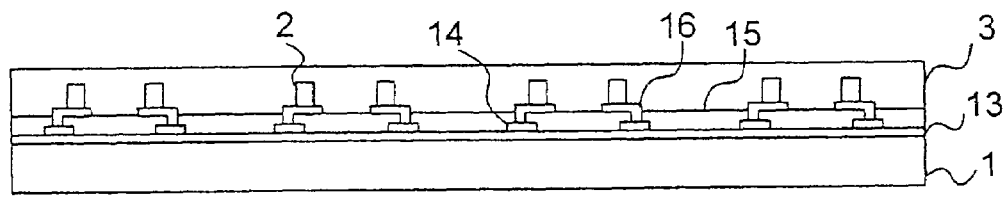

Next, a sealing resin 3 is poured over the entire main surface of the semiconductor wafer 1 up to a height at which the copper posts 2 become completely covered (see FIG. 1(B)). The sealing resin 3 may be applied through transfer molding, potting or printing.

(C) Resin Grinding

Figure 1C:
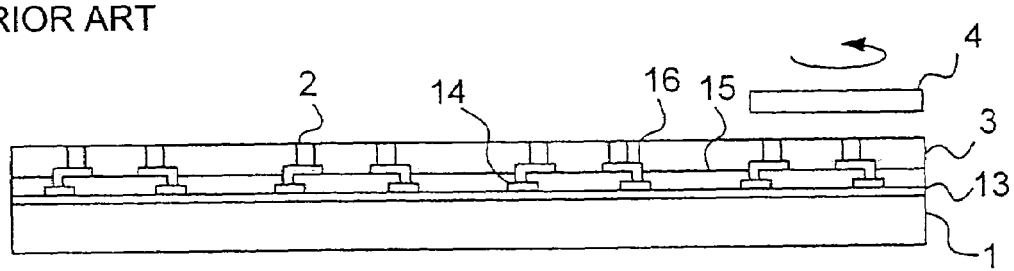

In the following step, the surface of the sealing resin 3 is ground with an abrasive 4 until the upper surfaces of the individual copper posts 2 buried in the sealing resin 3 become exposed (see FIG. 1(C)).

(D) External Connection Terminal Formation

Next, the following process is executed at the upper surfaces of the copper posts 2 to form the external connection terminals 5 in a grid pattern (matrix pattern). These external connection terminals 5 function as terminals that electrically connect the individual semiconductor device units to wirings on the mounting substrate at which the semiconductor devices are mounted.

First, a metal mask to be used to form the external connection terminals 5 is prepared. This metal mask includes a plurality of openings at positions corresponding to those of the copper posts 2 so as to enable the formation of the external connection terminals 5 at the upper surfaces of the copper posts 2. Next, the metal mask is placed over the surface of the sealing resin 3 so as to set the plurality of openings over the upper portions of the corresponding copper posts 2. The external connection terminals 5 are formed subsequently by pouring a solder paste over the entire metal mask (see FIG. 1(D)). It is to be noted that since the solder paste does not adhere to the sealing resin 3, the external connection terminals 5 can be formed at the upper surfaces of the copper posts 2 even if the openings at the metal mask are not perfectly aligned with the upper surfaces of the copper posts 2. For this reason, the degree of accuracy that the metal mask is required to achieve in its shape is not as rigorous as that required of the shape that needs to be achieved by the resist used in the copper post formation process (A).

Through the processes described above, numerous semiconductor devices are formed as a package on the semiconductor wafer 1.

(E) Cutting Individual Units

Figure 1D:
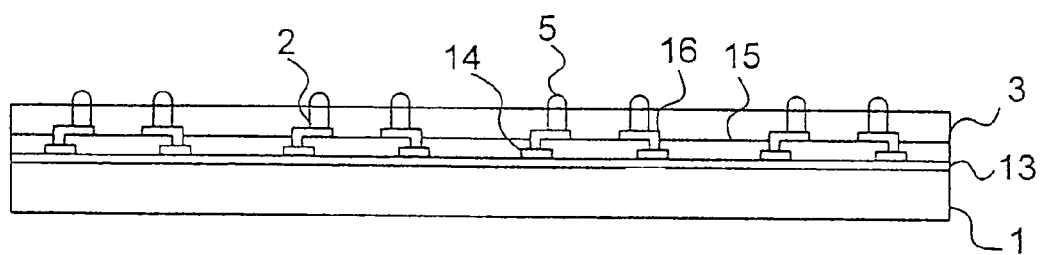
Figure 1E:
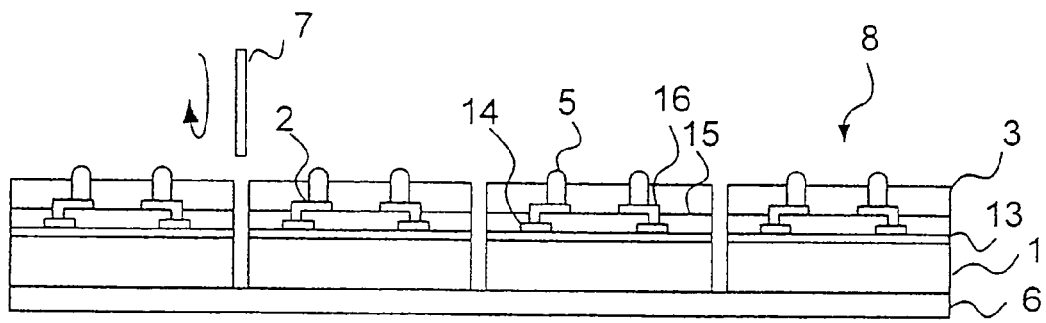

Next, with a grinding tape 6 attached onto the rear surface (circuit non-forming surface) of the semiconductor wafer 1, the semiconductor wafer 1 is cut into individual units of semiconductor devices 8 by a cutting blade 7 rotating at high speed (see FIG. 1(E)).

(F) Chipping

The semiconductor devices 8 still attached to the grinding tape 6 are set on a wafer carrier 9 and are set at a position directly under a pickup collet 10. Then, each semiconductor device 8 is separated from the grinding tape 6 by the combination of the suction of a vacuum connected to the pickup collet 10 and the thrusting force imparted by a thrust mechanism (needle-like pin) 12 (see FIG. 2(A)). After undergoing a product test, the individual semiconductor devices 8 are loaded in embossed adhesive holes 11a of an embossed carrier tape 11 and are shipped as products (see FIG. 2(B)).

In the explanation given above, the standard wafer-level CSP technology is described.

The explanation of the individual embodiments given below focuses on processes different from the processes implemented in the standard wafer-level CSP technology and a repeated explanation of similar processes is omitted.

(First Embodiment)

The first embodiment of the present invention is now explained.

Figure 3:
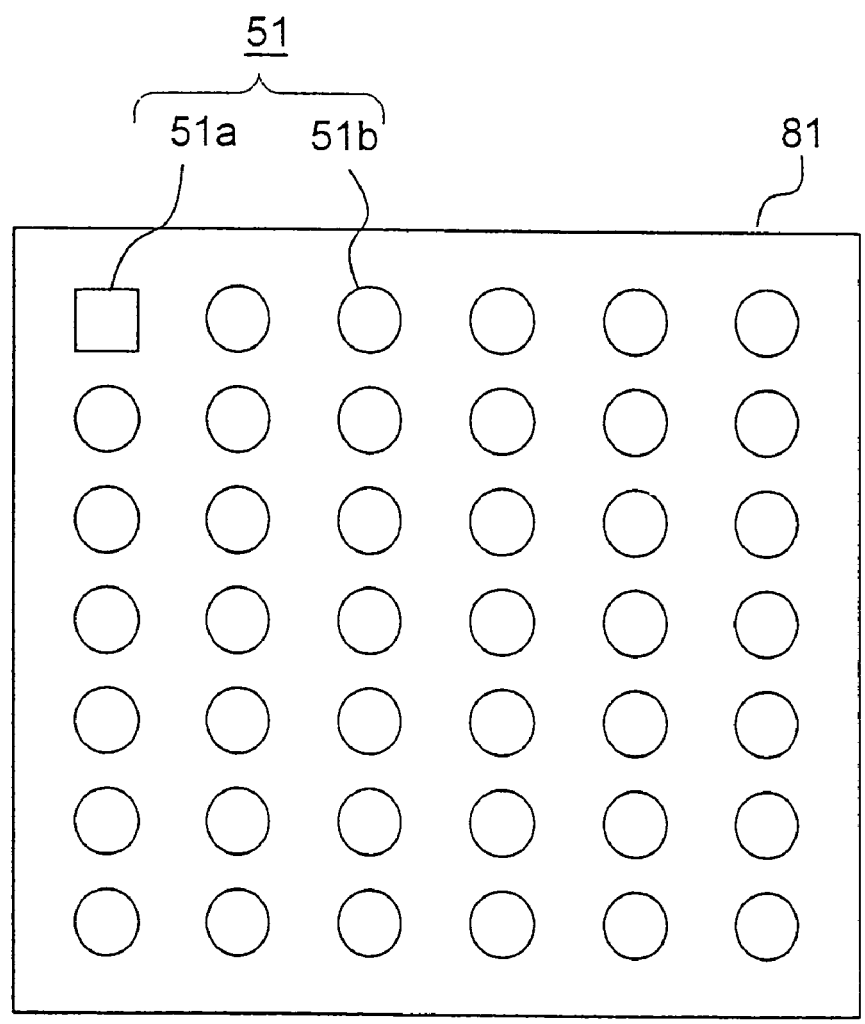
FIG. 3 presents a plan view of the semiconductor device achieved in a first embodiment.

FIG. 3 presents a plan view of a semiconductor device 81 manufactured through the manufacturing method in the first embodiment, viewed from the side where its main surface is present. The semiconductor device 81 is characterized in that an external connection terminal 51a positioned in one of the four corners among external connection terminals 51 provided in a grid pattern (matrix pattern) is formed in a shape different from the shape of the other external connection terminal 51b and in that the external connection terminals 51a is utilized as an index mark to indicate the direction along which the semiconductor device 81 should be mounted.

The following is an explanation of how such external connection terminals 51 may be formed. A resist having the pattern shown in FIG. 3 is used to form the copper posts 2 in the copper post formation process (A). Namely, a resist achieving the pattern shown in FIG. 3 is utilized so as to form the copper post in one of the four corners among the copper posts 2 arrayed in the grid pattern (matrix pattern) in a shape different from the shape of the other copper posts, as shown in FIG. 3. More specifically, a resist pattern having an opening formed to have a rectangular sectional shape at the position corresponding to the position of the external connection terminal 51a is used.

In addition, a metal mask achieving the pattern shown in FIG. 3 is utilized to form the external connection terminals 5 during the external connection terminal formatting process (D). Namely, a metal mask achieving the pattern shown in FIG. 3 is utilized so as to form the external connection terminal 51a in one of the four corners among the external connection terminals 51 arrayed in the grid pattern (matrix pattern) in a shape different from the shape of the other external connection terminal 51b, as illustrated in FIG. 3. More specifically, a metal mask pattern having an opening with a rectangular sectional shape at the position corresponding to the position of the external connection terminal 51a is used.

It is to be noted that since the solder paste does not adhere to the sealing resin 3, the shapes of the external connection terminals 51 are defined in conformance to the shapes of the upper surfaces of the copper posts 2 even if the positions of the openings in the metal mask are not perfectly aligned with the upper surfaces of the copper posts 2. For this reason, the degree of precision required in the shapes of the openings in the metal mask used in the external connection terminal formation process (D) is not as rigorous as the precision required of the shapes of the openings in the resist used in the copper post formation process (A).

In addition, while the solder paste becomes slightly deformed due to the heat generated during the reflow process, this should not pose any problem as long as it can be ascertained that the shape of the external connection terminal 51a in one of the four corners is different when the semiconductor device 81 is viewed from above. Since the shape of the semiconductor device 81 viewed from above is determined in conformance to the shapes of the bottom surfaces of the external connection terminals 51, i.e., in conformance to the shapes of the upper surfaces of the copper posts 2, a slight deformation of the solder paste occurring during the reflow process should not affect the function of the external connection terminal 51a as an index mark.

The semiconductor device 81 having the external connection terminal 51a in one of the four corners among the external connection terminals 51 arrayed in a grid pattern (matrix pattern) formed differently from the shape of the other external connection terminals 51b is manufactured through the processes described above.

As explained above, an external connection terminal 51 formed in a specific shape can be used as an index mark in the embodiment. As a result, the following outstanding advantages are achieved.

1) Since no special process for adding index marks is required, the positional adjustment for aligning the index marks to the positions of individual semiconductor devices is not necessary, either.
2) Since an external connection terminal formed in a specific shape is utilized as an index mark, there is no risk of the index mark coming off the semiconductor device unlike in the related art in which an index mark is formed with ink. In addition, unlike in the related art in which an index mark is formed with laser light, the circuit pattern inside the device does not become degraded.
3) The shape of an external connection terminal 5 having a side (diameter) of approximately 400 μm (0.4 mm) can be identified with the naked eye. Thus, the mounting direction can be ascertained with ease.

(Second Embodiment)

The second embodiment of the present invention is now explained.

Figure 4:
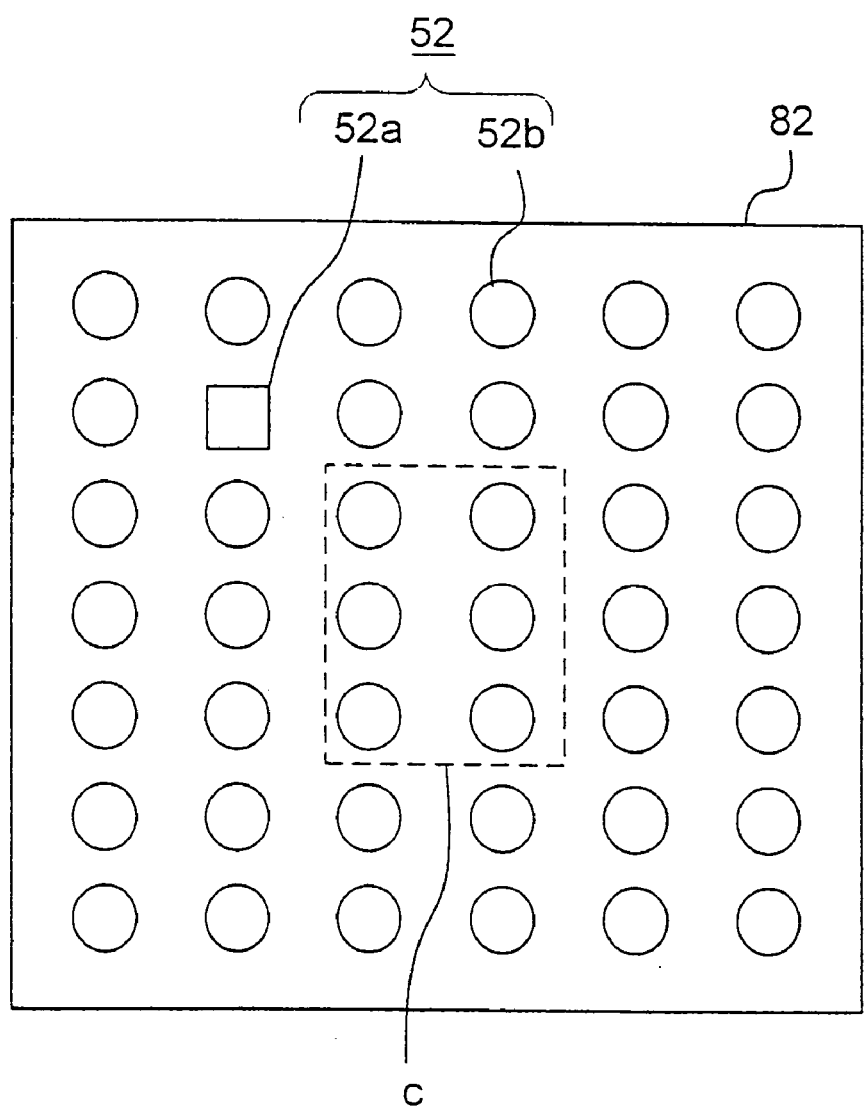
FIG. 4 presents a plan view of the semiconductor device achieved in a second embodiment.

FIG. 4 presents a plan view of a semiconductor device 82 manufactured through the manufacturing method in the second embodiment, viewed from the side where its main surface is present. The semiconductor device 82 is characterized in that an external connection terminal 52a, which is not one of the external connection terminals (within an area C in the figure) near the center, among external connection terminals 52 arrayed in a grid pattern (matrix pattern) is formed in a shape different from the shape of the other external connection terminals 52b to be utilized as an index mark indicating the direction along which the semiconductor device 82 is mounted.

Such external connection terminals 52 are formed by using a resist achieving the pattern shown in FIG. 4 during the copper post formation process (A) and a metal mask achieving the pattern shown in FIG. 4 during the external connection terminal formation process (D) in a manner similar to that explained in reference to the first embodiment.

The external connection terminal formed in a different shape to be used as an index mark may be any external connection terminal other than those near the center (within the area C in the figure). Unlike in the first embodiment, the external terminal to function as an index mark does not need to be provided in one of the four corners in the embodiment. Thus, since an index mark can be provided at a position other than one of the four corners of the grid pattern (matrix pattern), a higher degree of freedom is afforded in the terminal layout design.

(Third Embodiment)

The third embodiment of the present invention is now explained.

Figure 5:
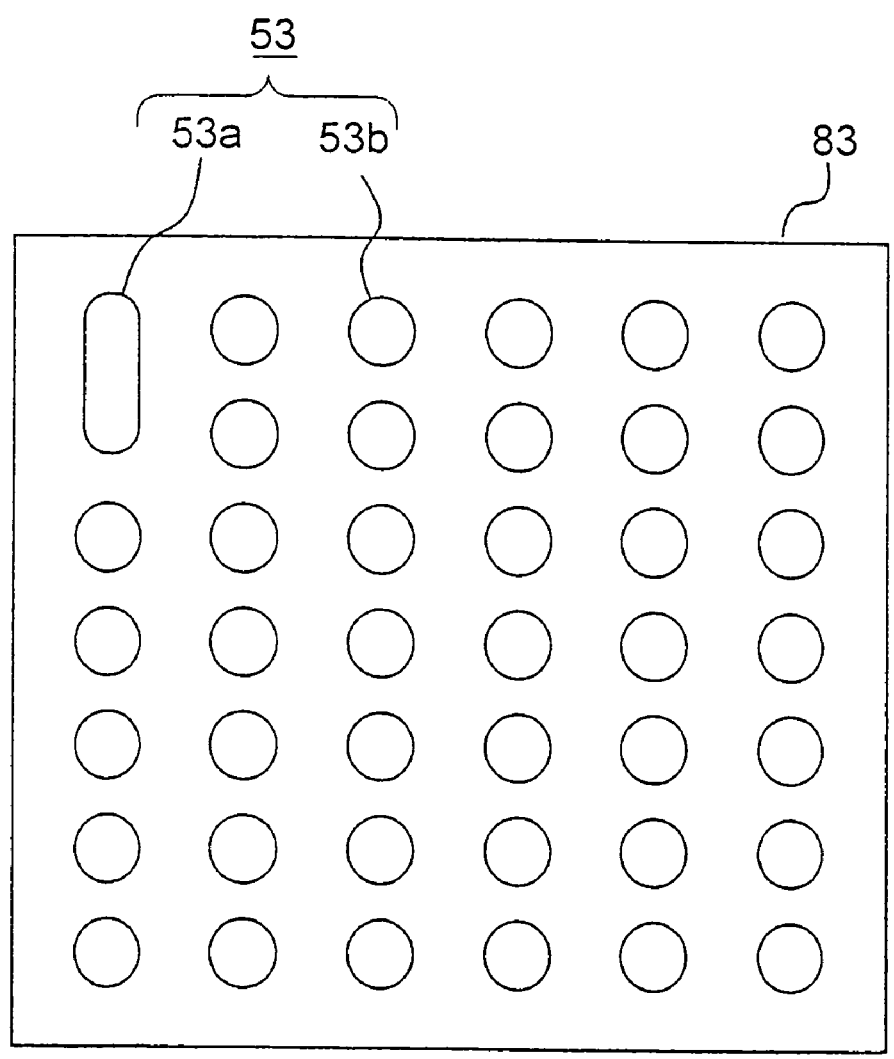
FIG. 5 presents a plan view of the semiconductor device achieved in a third embodiment.

FIG. 5 presents a plan view of a semiconductor device 83 manufactured through the manufacturing method in the third embodiment, viewed from the side where its main surface is present. The semiconductor device 83 is characterized in that an integrated external connection terminal 53a achieved by forming an external connection terminal in one of the four corners and an adjacent external connection terminal among external connection terminals 53 arrayed in a grid pattern (matrix pattern) as one to be used as an index mark indicating the mounting direction of the semiconductor device 83.

A plurality of external connection terminals, such as terminals to be connected to a ground line, may be provided to achieve a single function. In such a case, two external connection terminals may be integrated to form a single external connection terminal 53a. Then, the external connection terminal 53a formed in a different shape in this manner can be utilized as an index mark.

Such external connection terminals 53 are formed by first connecting a plurality of electrode pads to achieve a single function (e.g., electrode pads for supplying the ground potential to the electronic circuit) to one another via the wirings 16 on the insulating film 15 during the process shown in FIG. 1(A).

Then, copper posts 2 are formed using a resist having openings with the sectional shapes shown in FIG. 5. Namely, the copper posts 2 are formed with a resist achieving the pattern shown in FIG. 5, which will expose the upper portion of the surface of the wirings 16 corresponding to the external connection terminal 53a to be used as the index mark and the upper portions of the surfaces of the wirings 16 corresponding to the other external connection terminals 53b.

Subsequently, the external connection terminals are formed with a metal mask having openings with the sectional shapes shown in FIG. 5 during the external connection terminal formation process shown in FIG. 1(D). Namely, the external connection terminals are formed by using a metal mask achieving the pattern shown in FIG. 5, which will expose the upper portion of the surface of the copper posts 2 corresponding to the external connection terminal 53a to be used as the index mark and the upper portions of the surfaces of the copper posts 2 corresponding to the other connection terminals 53b.

(Fourth Embodiment)

The fourth embodiment of the present invention is explained.

Figure 6A:
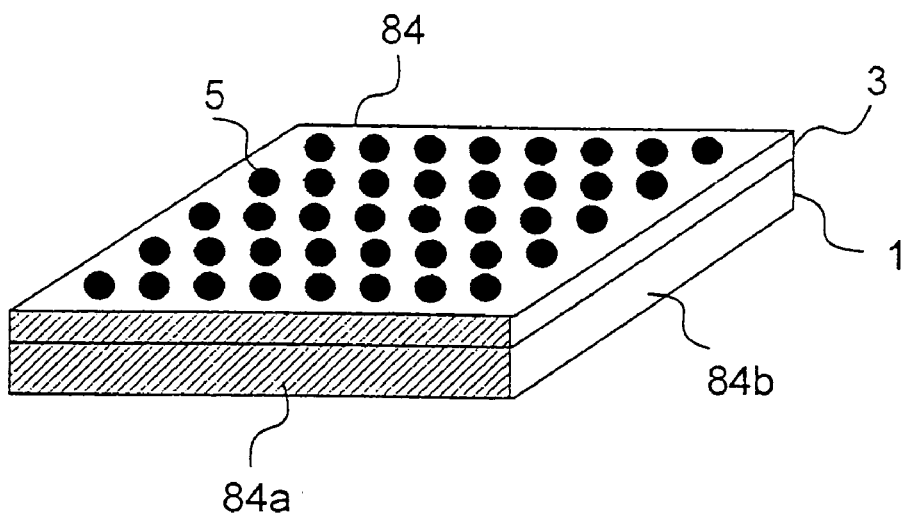
FIGS. 6(A)–6(B) present perspective views of the semiconductor device achieved in a fourth embodiment.

FIG. 6(A) shows a perspective of a semiconductor device 84 manufactured through the manufacturing method in the fourth embodiment. The semiconductor device 84 is characterized in that the color of one side surface 84a is different from the color of the other side surfaces 84b. The various types of information can be carried by coloring (not coloring the side surface or by combining different colors.

Figure 2:
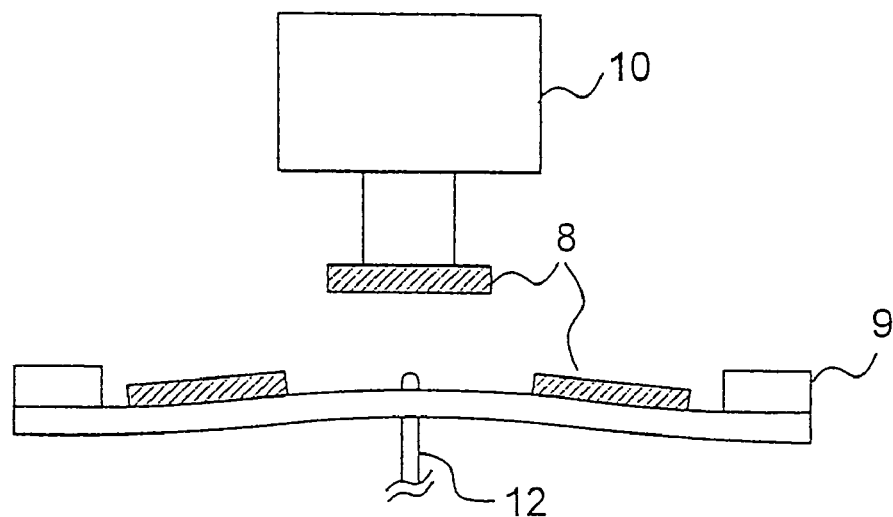
FIGS. 2(A)–2(B) illustrate manufacturing processes following the manufacturing processes shown in FIG. 1.
Figure 2:
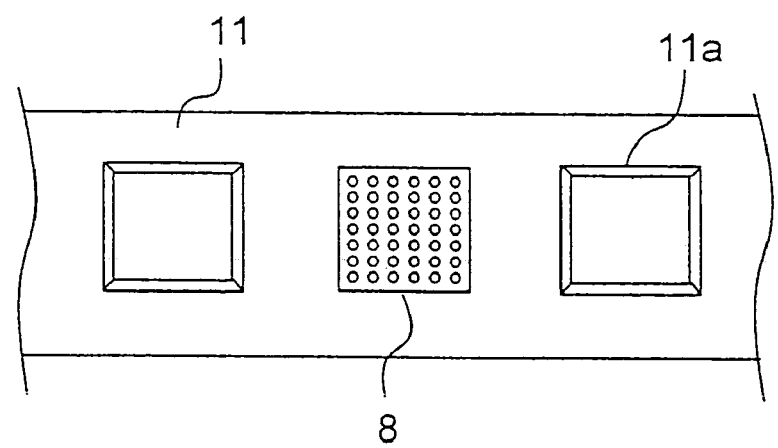

The side surface of the semiconductor device can be colored while the semiconductor device is vacuum-held by the pickup collet 10 during the semiconductor device chipping process (E) shown in FIG. 2.

Figure 6B:
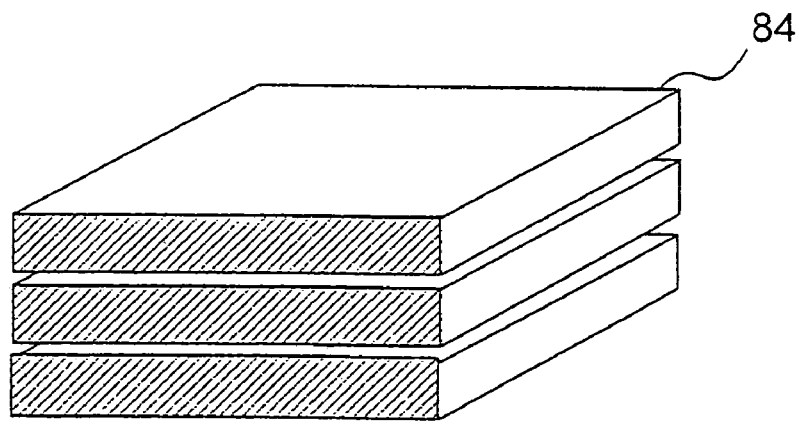

While most chip size packages are mounted in single-layer surface mounting, semiconductor devices achieving a multiple layer structure can be mounted at a mounting substrate by using the index marks of the individual semiconductor devices set one on top of another, which are each constituted of a side surface of a semiconductor device to facilitate the verification of the mounting direction, as shown in FIG. 6(B).

(Fifth Embodiment)

The fifth embodiment of the present invention is explained.

Figure 7A:
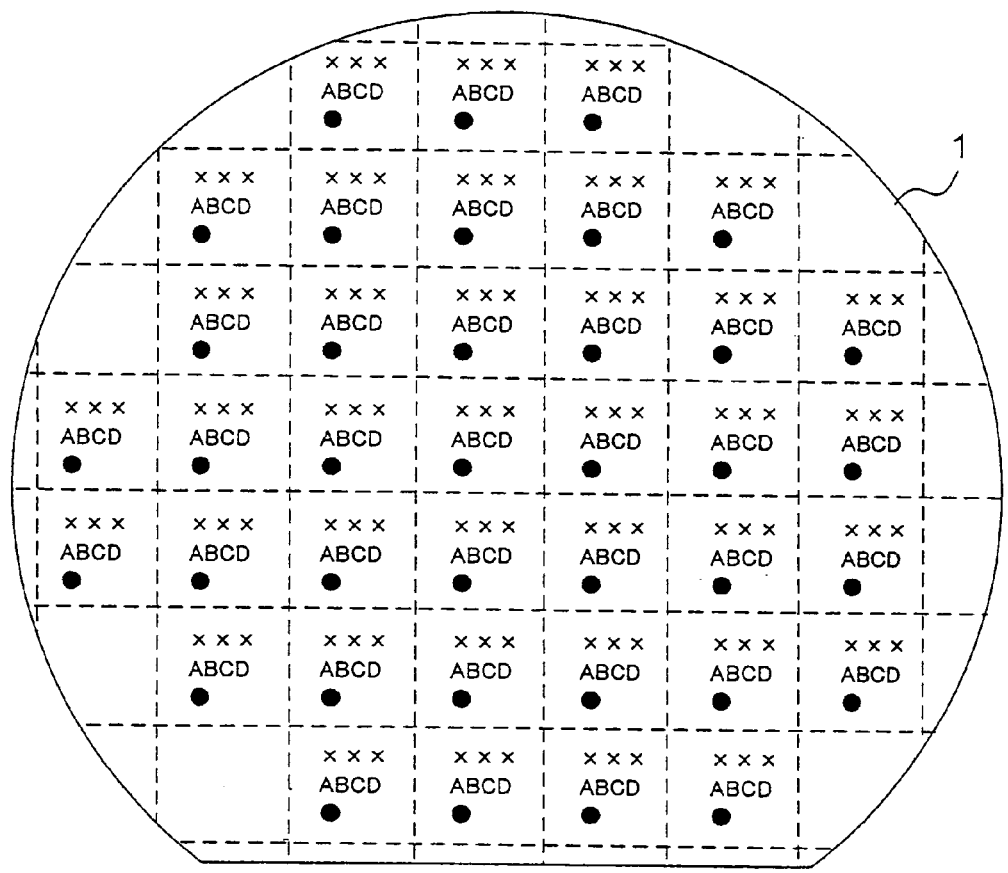
FIGS. 7(A)–7(B) present a plan view of the semiconductor device achieved in a fifth embodiment.
Figure 7B:
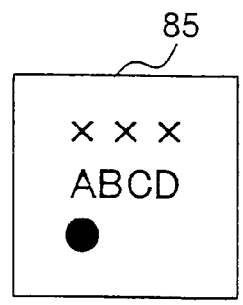

FIG. 7A presents a plan view of a semiconductor wafer 1 before it is separated into individual semiconductor device units in the manufacturing method achieved in the fifth embodiment, viewed from the side where its rear surface (circuit non-forming surface) is present. In the example shown in FIG. 7(A), each area enclosed by dotted lines indicates a single semiconductor device. FIG. 7(B) shows a semiconductor device 85 obtained by dividing the semiconductor wafer 1 into individual pieces. This embodiment is characterized in that index marks are added onto the rear surface of the semiconductor wafer 1 during the wafer phase, as shown in FIG. 7(A), with an index mark provided in each semiconductor device 85 obtained by dividing the semiconductor wafer 1 into the individual pieces, as shown in FIG. 7(B).

An index mark in this embodiment, which includes character information (X X X ABCD) and a filled circle provided under the character information on the left side in the figures, carries information such as the semiconductor device type, the direction along which the semiconductor device is mounted relative to the mounting substrate and the orientation of the semiconductor device itself.

As shown in FIG. 7(B), it is necessary to add the index mark in correspondence to the size of each semiconductor device in order to ensure that the index mark is set at the correct position without becoming misaligned at the semiconductor device obtained by dividing the wafer into individual semiconductor device units. The corresponding character information and the like may be provided for each semiconductor element by positioning the index marks in conformance to its shape of the semiconductor wafer 1 (orientation flat) or by positioning the index marks by seeing through the internal patterns from the rear surface of the semiconductor wafer 1.

Then, after adjusting the inclination of the wiring pattern formed within a device and adjusting the position of a specific single point, index marks can be added in a batch at the wafer level by moving the wafer with a pitch conforming to the size of the specific semiconductor devices. As described above, the fifth embodiment, in which the index marks formed at the semiconductor devices are added at the wafer level, does not require the positional adjustment between the individual semiconductor devices and the apparatus used to add the index marks implemented in the related art in which the index marks are added onto the semiconductor devices obtained by dividing the semiconductor wafer into individual semiconductor device units. As a result, a great reduction is achieved in the length of time required to implement the process for adding the index marks.

(Sixth Embodiment)

The sixth embodiment of the present invention is explained.

Figure 8A:
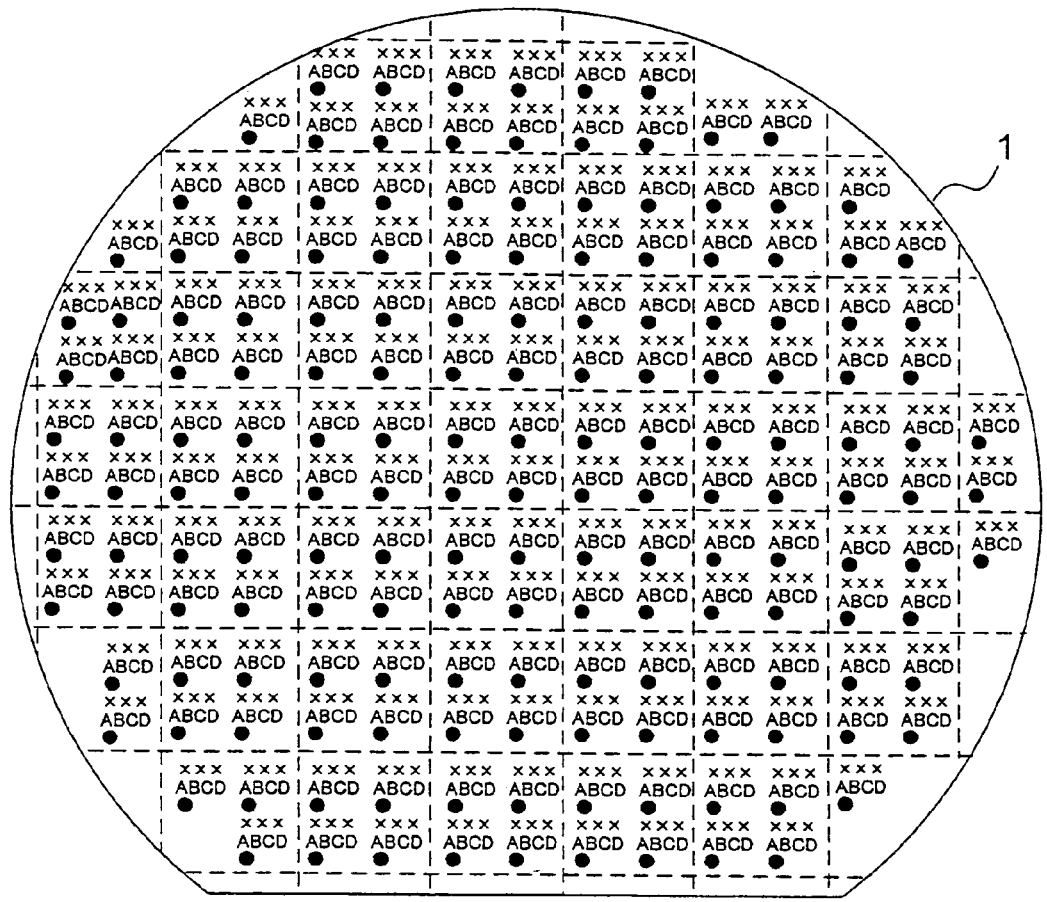
FIGS. 8(A)–8(B) present a plan view of the semiconductor device achieved in a sixth embodiment.
Figure 8B:
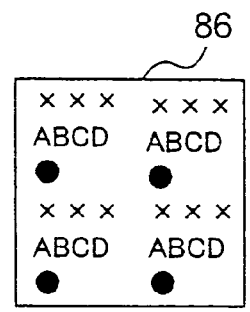

FIG. 8(A) presents a plan view of a semiconductor wafer 1 before it is separated into individual semiconductor device units in the manufacturing method achieved in the sixth embodiment, viewed from the side where the rear surface (circuit non-forming surface) is present. In the example shown in FIG. 8(A), each area enclosed by dotted lines indicates a single semiconductor device. FIG. 8(B) shows a semiconductor device 86 obtained by dividing the semiconductor wafer 1 into individual pieces. This embodiment is characterized in that index marks are added onto the rear surface of the semiconductor wafer 1 during the wafer phase, as shown in FIG. 8(A), with an index mark provided in each semiconductor device 86 obtained by dividing the semiconductor wafer 1 into the individual pieces, as shown in FIG. 8(B). In this aspect, the sixth embodiment is similar to the fifth embodiment.

What differentiates the sixth embodiment is that the index marks are much smaller than the size of each semiconductor device 86. In other words, the size of the index marks is set small enough to ensure that even if the index marks are added onto the rear surface of the semiconductor wafer 1 without adjusting the relative positions of the individual semiconductor devices 86 (each corresponding to an area defined by the dotted lines in FIG. 8(A)) and the index marks, at least one index mark is bound to be present on each semiconductor device.

As described above, the sixth embodiment, which makes it possible to add a plurality of index marks onto a single semiconductor device 86, allows index marks to be provided without any restrictions imposed by the position concept of the semiconductor devices. In addition, since at least one index mark is bound to be present at each of the semiconductor devices after the semiconductor wafer 1 is divided into individual semiconductor device units, it is ensured that the necessary information is provided at each semiconductor device.

(Seventh Embodiment)

The seventh embodiment of the present invention is explained.

Figure 9A:
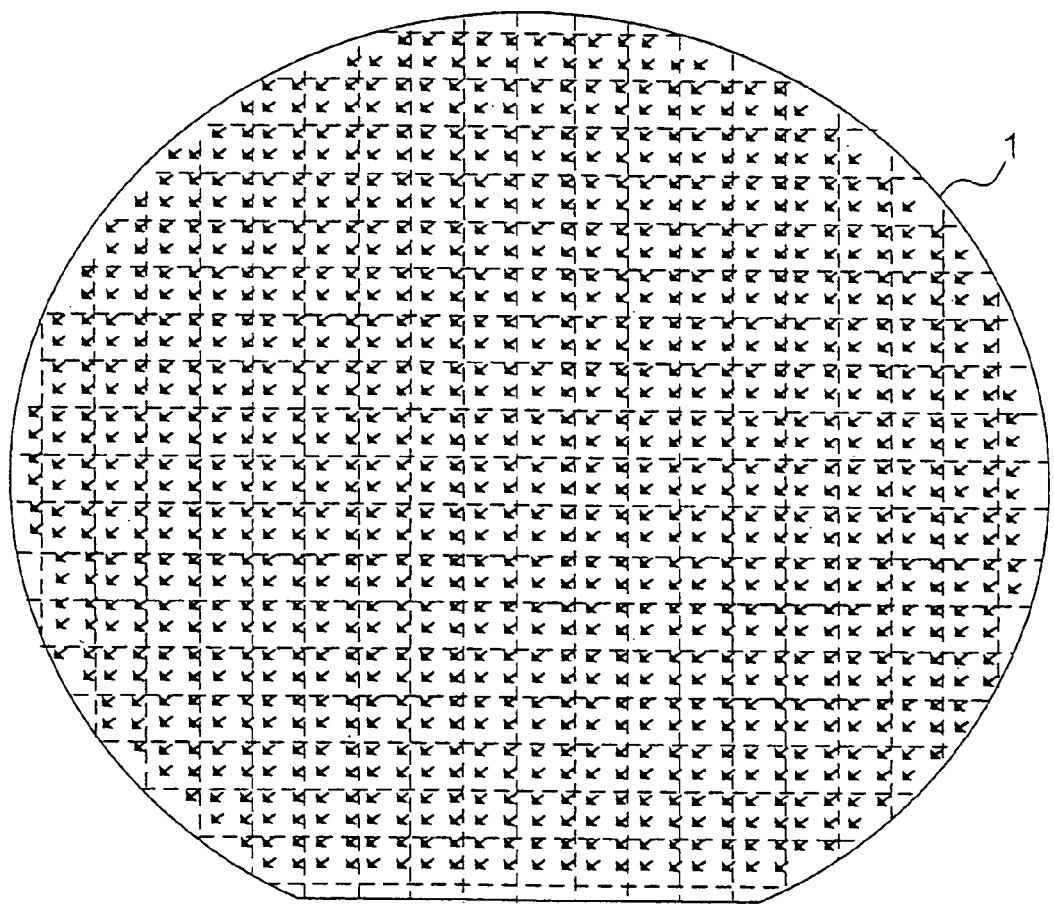
FIGS. 9(A)–9(B) present a plan view of the semiconductor device achieved in a seventh embodiment.
Figure 9B:
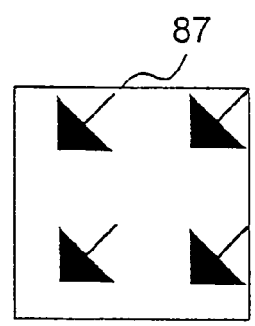

FIG. 9(A) presents a plan view of a semiconductor wafer 1 before it is separated into individual semiconductor device units in the manufacturing method achieved in the seventh embodiment, viewed from the side where its rear surface (circuit non-forming surface) is present. In the example shown in FIG. 9(A), each area enclosed by dotted lines indicates a single semiconductor device. FIG. 9(B) shows a semiconductor device 87 obtained by dividing the semiconductor wafer 1 into individual pieces. This embodiment is characterized in that index marks are added onto the rear surface of the semiconductor wafer 1 during the wafer phase, as shown in FIG. 9(A), with index marks provided in each semiconductor device 87 obtained by dividing the semiconductor wafer 1 into the individual pieces, as shown in FIG. 9(B). In this aspect, the seventh embodiment is similar to the sixth embodiment.

What differentiates the seventh embodiment is that the index marks are constituted of symbols indicating the direction along which the semiconductor devices 87 are to be mounted at the mounting substrate. The index marks in the embodiment are each constituted of a line segment which includes a start point and an end point and a mark indicating the end point. More specifically, each index mark is formed as an arrow.

As it is more difficult to position index marks to be formed at miniaturized semiconductor devices, the area occupied by each index mark must be reduced. This may be achieved by adding filled circles alone to individual semiconductor devices in the wafer state, as shown in FIG. 8. However, while the filled circles are provided at individual semiconductor devices through this method, the filled circles present at the semiconductor devices after the semiconductor wafer is divided into the individual semiconductor device units may not always function as index marks. Namely, if there is a misalignment between the positions of the individual semiconductor devices and the position of the apparatus utilized to add the index marks (e.g., the nozzle of an ink-jet apparatus) during the index mark formation process, the index marks can become offset at all the semiconductor devices. In the worst case scenario, an index mark that should be added onto one semiconductor device may end up on an adjacent semiconductor device. As a result, a first pin which is actually present at a lower left position of the drawing sheet in a semiconductor device unit may be erroneously judged to be present at an upper right position.

Figure 10A:
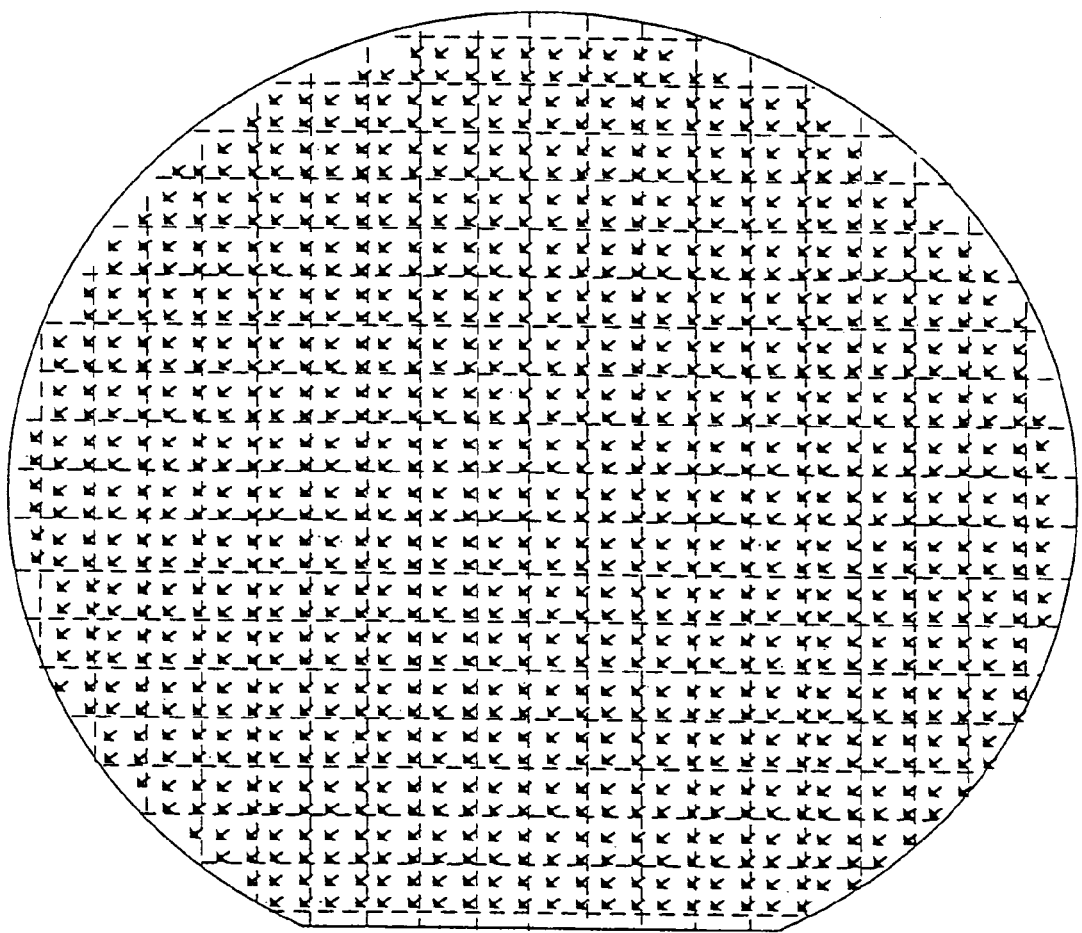
FIGS. 10(A)–10(C) present another plan view of the semiconductor device achieved in the seventh embodiment.
Figure 10B:
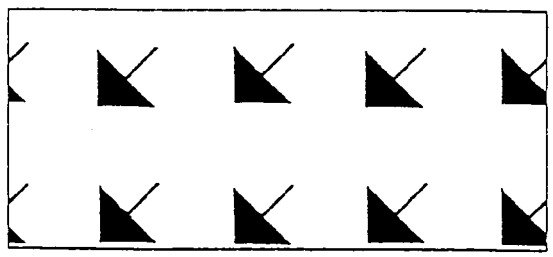
Figure 10C:
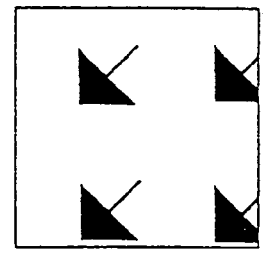

FIG. 10(A) illustrates how the positions of the individual semiconductor devices and the position of the apparatus utilized to add index marks (e.g., the nozzle of an ink-jet apparatus) may become misaligned during the index mark formation process. FIG. 10(B) shows one of the semiconductor devices obtained by dividing the semiconductor wafer shown in FIG. 10(A) into individual semiconductor device units. As FIG. 10(B) clearly indicates, it is possible to ascertain that the first pin is present at the lower left position in the drawing sheet in each semiconductor device unit with a high degree of reliability in the embodiment, even if the misalignment described above has occurred. FIG. 10(C) shows one of the individual semiconductor device units having external dimensions set larger than that shown in FIG. 10(B). In the embodiment, even when the external dimensions of semiconductor devices obtained by dividing a semiconductor wafer into individual semiconductor device units vary, the presence of the first pin at the lower left position of the drawing sheet in each semiconductor device unit can be ascertained with a high degree of reliability.

As described above, the seventh embodiment makes it possible to provide index marks in smaller semiconductor devices in addition to achieving the advantages described earlier in reference to the fifth embodiment. Furthermore, the index marks can be provided without having to ensure that the positions of the individual semiconductor devices and the position of the apparatus utilized to add the index marks (e.g., the nozzle of an ink-jet apparatus) are accurately aligned with each other in the embodiment. Moreover, the embodiment allows the index marks to be added without having to take into consideration the external dimensions of the individual semiconductor devices.

While the invention has been particularly shown and described with respect to preferred embodiments of the semiconductor device and the manufacturing method thereof according to the present invention by referring to the attached drawings, the present invention is not limited to these examples and it will be understood by those skilled in the art that various changes in form and detail may be made therein without departing from the spirit, scope and teaching of the invention.

For instance, while an explanation is given above on a method for manufacturing wafer-level CSP semiconductor devices in reference to the embodiments above, the semiconductor devices (see FIGS. 3~5) in the first~third embodiments do not need to be manufactured as wafer-level CSPs.

In addition, while external connection terminals are provided over the entire grid pattern (matrix pattern) in FIGS. 3~5, the present invention is not limited to this example. Even when some external connection terminals in the grid pattern (matrix pattern) are missing, one of the external connection terminals that are actually provided can be formed in a different shape to function as an index mark.

While an explanation is given above in reference to the third embodiment on an example in which the external connection terminal in one of the four corners and an adjacent external connection terminal are formed as one to constitute an integrated external connection terminal 53a (see FIG. 5), the present invention is not limited to this example. The external connection terminal formed by integrating a plurality of external connection terminals only needs to be present at a position at which it can function as an index mark outside of the vicinity of the center of the semiconductor device.

In some of the embodiments explained above, the index marks are used to indicate the direction along which the semiconductors are to be mounted at the mounting substrate. However, the index marks may be provided to indicate the direction of the semiconductor devices themselves. In other words, an index mark may be a mark that indicates the position at which the first pin mark of a given semiconductor device is present, instead.

In addition, in the embodiments described above, the external connection terminal to function as an index mark is a terminal electrically connected to the electronic circuit. However, the index mark may be constituted of a terminal that is not electrically connected to the electronic circuit, i.e., a so-called non-connect pin.

While the individual manufacturing processes explained in reference to the embodiments are expected to be modified as further progress is made in the field of the semiconductor manufacturing technology, the processes that do not bear direct relevance to the features of the present invention are not bound by details explained in reference to the embodiments and may be modified as appropriate.

As explained above, the present invention achieves the following major advantages.

1) Since no special process is required to add index marks, it is no longer necessary to perform a positional adjustment to align the index marks with the positions of the individual semiconductor devices.

2) Unlike ink-based index marks formed in the related art, an index mark constituted by forming an external connection terminal in a specific shape according to the present invention does not come off the semiconductor device. In addition, unlike index marks formed by using laser light in the related art, the index marks according to the present invention do not degrade the circuit patterns within the semiconductor devices.

3) The shapes of the external connection terminals having a side (diameter) ranging over approximately 400 μm (0.4 mm) can be recognized with the naked eye. Thus, the mounting direction can be ascertained with ease.

What is claimed is:

1. A semiconductor device comprising:
   a semiconductor substrate that includes a first main surface having a circuit element formed thereon, and a second main surface opposite to said first main surface;
   a plurality of external terminals formed at an upper portion of said first main surface and electrically connected to said circuit element; and
   a plurality of direction index marks formed on said second main surface,
   wherein each direction index mark is an arrow,
   wherein each arrow has a line segment having a start point, an end point, and an end point mark provided at said end point, and
   wherein all the line segments are parallel to each other.

2. A semiconductor device according to claim 1, wherein the direction index marks point to a predesignated pin of the semiconductor device.

3. A semiconductor device comprising:
   a semiconductor substrate including a first main surface having a circuit element formed thereon, and a second main surface at a side opposite the first main surface;
   a plurality of external terminals formed on the first main surface and electrically connected to the circuit element; and
   a plurality of direction index marks, formed on the second main surface, wherein each direction index mark is an arrow,
   wherein each arrow has a line segment that indicates the direction along which the semiconductor device is to be mounted, and
   wherein all the line segments are parallel to each other.

4. A semiconductor device according to claim 3, wherein each arrow includes an indicated start point and an indicated end point.

5. A semiconductor device according to claim 3, wherein the direction index marks point to a predesignated pin of the semiconductor device.

* * * * *